US009250999B1

(12) United States Patent
Barroso

(10) Patent No.: US 9,250,999 B1
(45) Date of Patent: Feb. 2, 2016

(54) NON-VOLATILE RANDOM ACCESS MEMORY IN COMPUTER PRIMARY MEMORY

(71) Applicant: GOOGLE INC., Mountain View, CA (US)

(72) Inventor: Luiz Andre Barroso, Los Altos, CA (US)

(73) Assignee: Google Inc., Mountain View, CA (US)

( * ) Notice: Subject to any disclaimer, the term of this patent is extended or adjusted under 35 U.S.C. 154(b) by 99 days.

(21) Appl. No.: 14/083,855

(22) Filed: Nov. 19, 2013

(51) Int. Cl.
*G11C 29/00* (2006.01)
*G06F 11/10* (2006.01)
*G06F 12/02* (2006.01)
*H03M 13/15* (2006.01)

(52) U.S. Cl.
CPC ........ *G06F 11/1068* (2013.01); *G06F 12/0246* (2013.01); *H03M 13/1515* (2013.01)

(58) Field of Classification Search
CPC ............ G06F 11/1658; G06F 12/0804; G06F 11/2043; G06F 11/2035; G06F 11/1471; G06F 11/1469; G06F 11/1076; G06F 11/1612; G06F 12/0684; G06F 3/065; G06F 12/0246; G06F 3/0604; G06F 3/067; G06F 3/0688; G06F 2003/0697; G06F 11/1068; G11B 33/127; H03M 13/1515
See application file for complete search history.

(56) References Cited

U.S. PATENT DOCUMENTS

| | | | | |
|---|---|---|---|---|
| 7,293,191 | B1 * | 11/2007 | Arumugham et al. | 714/5.11 |
| 8,719,520 | B1 * | 5/2014 | Piszczek et al. | 711/161 |
| 2003/0005354 | A1 * | 1/2003 | Kalman | 714/7 |
| 2005/0038958 | A1 * | 2/2005 | Jadon et al. | 711/114 |
| 2005/0039090 | A1 * | 2/2005 | Jadon et al. | 714/718 |
| 2007/0038593 | A1 * | 2/2007 | Critchley et al. | 707/1 |
| 2008/0082750 | A1 * | 4/2008 | Okin et al. | 711/115 |
| 2008/0151724 | A1 * | 6/2008 | Anderson et al. | 369/53.42 |
| 2009/0049251 | A1 * | 2/2009 | Bartfai et al. | 711/154 |
| 2009/0313617 | A1 * | 12/2009 | Hung | 717/168 |
| 2012/0278528 | A1 * | 11/2012 | Galbraith et al. | 711/103 |
| 2013/0290759 | A1 * | 10/2013 | Kumar et al. | 713/323 |
| 2013/0339572 | A1 * | 12/2013 | Fanning et al. | 711/102 |
| 2014/0013045 | A1 * | 1/2014 | Crossland et al. | 711/105 |
| 2014/0173017 | A1 * | 6/2014 | Takagi et al. | 709/213 |
| 2014/0201314 | A1 * | 7/2014 | Borkenhagen | 709/216 |
| 2014/0281152 | A1 * | 9/2014 | Karamcheti et al. | 711/103 |
| 2014/0304469 | A1 * | 10/2014 | Wu | 711/114 |
| 2015/0082081 | A1 * | 3/2015 | Akirav et al. | 714/6.22 |

* cited by examiner

*Primary Examiner* — Guerrier Merant
(74) *Attorney, Agent, or Firm* — Brake Hughes Bellermann LLP

(57) ABSTRACT

A method includes deploying non-volatile random access memory (NVRAM) in a memory arrangement coupled to a CPU core of a computing device via a memory bus. The method further includes configuring the CPU core to conduct NVRAM read operations directly over the memory bus, and providing an I/O logic device to process write instructions initiated by the CPU core as a Direct Memory Access (DMA) write operation on the NVRAM.

25 Claims, 7 Drawing Sheets

500

510

Provide NVRAM as memory modules (e.g., dual-in-line memory modules (DIMMs)) in a memory arrangement coupled to the CPU core of the computing device via a memory bus

520

Configure the CPU core to conduct NVRAM read operations over the memory bus

530

Use an I/O logic device (e.g., a NVRAM write controller) to process NVRAM write instructions initiated by the CPU core as a Direct Memory Access (DMA) write operation on the NVRAM

532
Use an I/O logic device disposed on an I/O bus of the computing device

534
Use an I/O logic device disposed in the CPU core of the computing device

Designating the addresses or portions of the NVRAM to which a NVRAM write operation is directed inaccessible to NVRAM read operations initiated by the CPU unit for a duration of the NVRAM write operation

620

Caching a copy of the data stored at the addresses or portions of the NVRAM before the NVRAM write operation begins

630

Encoding data in multiple places in the NVRAM to create data replicas in the NVRAM, or encoding data in multiple places in the NVRAM using an error correction code that allows reconstruction of data stored in a portion of the NVRAM that is not read-accessible during a DMA write operation (or erased, damaged or corrupted) by decoding data in a portion or portions of the NVRAM that are read-accessible (630).

> 632
> encoding and decoding data stored in the NVRAM using an Error Correction Code (ECC) controller coupled to the NVRAM

640
Making a copy (a cached copy, a replica copy or a reconstructed copy) of the data, which was stored at the addresses or portions of the NVRAM before the NVRAM write operation began, available for NVRAM read operations initiated by the CPU unit for the duration of the NVRAM write operation

FIG. 6

NON-VOLATILE RANDOM ACCESS MEMORY IN COMPUTER PRIMARY MEMORY

TECHNICAL FIELD

This disclosure generally relates to computing devices (e.g., servers, desktop computers, laptops, smartphones, etc.). In particular, the disclosure relates to management of memory in the computing devices.

BACKGROUND

One of the most-demanded resources in computing devices (other than the CPU) is system memory. In computing, memory refers to the physical devices used to store programs or data on a temporary or permanent basis for use in a computer or other digital electronic device. The term primary memory is used for semiconductor memory devices (i.e. dynamic random access memory (DRAM) and static random access memory (SRAM)), which function at high-speed. The term secondary memory is used for memory devices such as hard disk drives (HDD) and solid state drives (SSD), which may be relatively slow to access but offer higher memory capacity than conventional random access memory (e.g., DRAM).

DRAM and SRAM are both volatile memory, i.e. they can maintain data only for as long as power is applied. This may be contrasted with non-volatile random access memory (NVRAM) that retains its information even when power is turned off.

Newer semiconductor chip technologies (e.g., phase-change memory, magneto-resistive memory (or memristors), spin-torque memory, etc.) have increased chip capacity so that a newer flash memory may now compete with conventional secondary memory (such as HHDs and SSDs) in offering higher memory capacity and also in slashing an access penalty for solid state storage (e.g., compared to SSDs). The newer flash memory may be as fast as conventional DRAM for processor load or read operations. However, the newer flash memory may still be significantly slower (~10×) than conventional DRAM for processor store or write operations (both in latency and throughput). For convenience in description herein, the newer high capacity flash memory may be referred to hereinafter as "non-volatile random access memory (NVRAM)".

Consideration is now being given to the use of NVRAM in memory arrangements that are coupled to a processor or processor unit in a computing device. In particular, attention is directed to mitigating or managing the effect of processor store or write operations for NVRAM that may be slower than those for conventional DRAM.

SUMMARY

In a general aspect, a method includes providing non-volatile random access memory (NVRAM) in a memory arrangement coupled to a processor (e.g., central processing unit (CPU)) of a computing device via a memory bus. The processor may include one or more CPU cores that are configured to conduct NVRAM read operations directly over the memory bus. The method further includes using an input/output (I/O) logic device coupled to the one or more CPU cores and the memory arrangement to process a write instruction initiated by one of the CPU cores as a Direct Memory Access (DMA) write operation on the NVRAM.

In a further aspect, the I/O logic device is disposed on an I/O bus of the computing device or on a same die or chip as the CPU cores in the processor of the computing device.

In a general aspect, a method for avoiding non-volatile random access memory (NVRAM) read-write conflicts in a computing device includes reconstructing a copy of data stored in a portion of a NVRAM in the computing device that is not read-accessible during a Direct Memory Access (DMA) write operation. The reconstruction may be based on data stored in a portion or portions of the NVRAM that are read-accessible. The method further includes making the reconstructed copy of the data stored in the portion of the NVRAM that is not read-accessible during the DMA write operation available to a NVRAM read operation initiated by a CPU core of the computing device for a duration of the DMA write operation.

In a general aspect, a computing device includes a processor (e.g., a central processor unit (CPU)). The processor may include one or more CPU cores coupled to a memory arrangement on a memory bus via a memory controller. The computing device further includes a non-volatile random access memory (NVRAM) disposed in the memory arrangement on the memory bus, and a NVRAM write controller connected to the CPU cores and the memory arrangement, the NVRAM write controller configured to access the memory arrangement independently of the one or more CPUs, where the CPU core is configured to conduct NVRAM read operations initiated by the one or more CPUs through the memory controller and to conduct NVRAM write operations initiated by the one or more CPUs through the NVRAM write controller configured to access the memory arrangement independently of the one or more CPUs.

In a general aspect, a memory module includes one or more NVRAM chips mounted on a circuit board, and a DRAM cache coupled to the one or more NVRAM chips. The DRAM cache is configured to cache a copy of data stored in a portion of the one or more NVRAM chips.

In a general aspect, a memory module includes one or more NVRAM chips mounted on a circuit board; and an error correction code (ECC) controller coupled to the one or more NVRAM chips. The ECC controller is configured to encode and decode data stored in the one or more NVRAM chips according to an error correction code.

The details of one or more implementations are set forth in the accompanying drawings and the description below. Other features will be apparent from the description and drawings, and from the claims.

BRIEF DESCRIPTION OF THE DRAWINGS

FIG. 5 is a flowchart illustration of an example method for deploying and managing NVRAM, which may be coupled to a CPU core of a computing device, in accordance with the principles of the disclosure herein.

FIG. 6 is a flowchart illustration of an example method for avoiding NVRAM read-write conflicts in a computing device in which NVRAM write operations initiated by a CPU core are conducted as Direct Memory Access (DMA) operations at a slower speed than NVRAM read operations initiated by the CPU core, in accordance with the principles of the disclosure herein.

Like reference symbols in the various drawings indicate like elements.

DETAILED DESCRIPTION

In a standard memory arrangement or architecture for a computer, a processor or processors in a central processor unit (CPU) core of the computer may access primary or system memory over a memory bus (e.g., a standard DRAM memory bus). DRAM (including various varieties of DRAM such as DDR, DDR2, DDR3, etc.) may be deployed in the primary or system memory as memory modules (e.g., dual in-line memory modules (DIMMs)) on the memory bus. The CPU core may have a load-store unit that loads data from memory or stores it back to memory from buffer registers. A memory controller may control the interactions (e.g., read/write operations) between the CPU and the DRAM modules on the on the DRAM memory bus. Further, in some implementations of the standard memory arrangement or architecture for the computer, the CPU and memory may be coupled via an I/O bus (e.g., PCI or PCI-express bus) to peripheral components or devices (e.g., disk drives, printers, network cards, etc.) of the computer. The peripheral components or devices may access memory over I/O bus. The I/O bus speeds may be slower than the DRAM memory bus speeds.

NVRAM may be deployed as memory modules (e.g., dual-in-line memory modules (DIMMs)) in a memory arrangement coupled to a CPU core of a computer via a memory bus, in accordance with the principles of the disclosure herein. The memory bus may be a standard DRAM memory bus, which may also co-host DRAM DIMMs. This arrangement of NVRAM DIMMS on a standard DRAM memory bus may exploit the feature that NVRAM read speeds are comparable to standard DRAM read speeds. However, NVRAM store (or write) speeds may be slower than standard DRAM store speeds. NVRAM store operations may have latencies which, for example, can be about 10× longer than standard DRAM store latencies. It may be expected that the slower NVRAM store speeds would be incompatible with conventional memory controller logic and CPU load/store units, which are designed for DRAM operations. By keeping regions of NVRAM address space busy or tied up for long durations, the slower NVRAM store operations may also interfere with read (or load) operations of the conventional memory controller logic and CPU load/store units in the computer.

In accordance with the principles of the present disclosure, systems and methods are provided herein for integrating use of NVRAM in computer memory arrangements and managing the effect of the asymmetrical NVRAM load and store access times. The disclosed systems and methods may involve using I/O style write operations (e.g., direct Memory Access (DMA) operations) for NVRAM stores while using memory bus read operations (e.g., DRAM read operations) for NVRAM loads.

Figure 1:
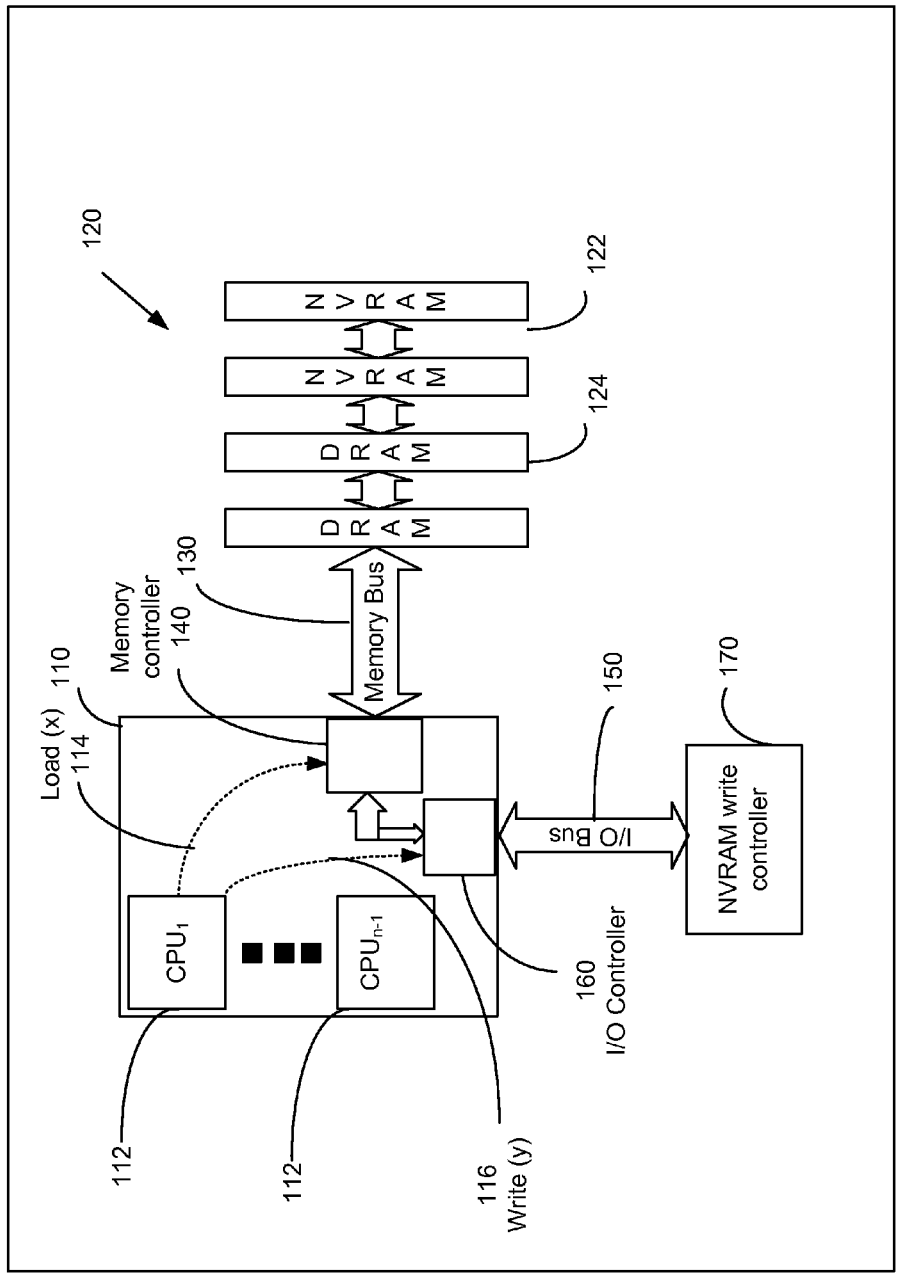
FIG. 1 is a schematic block diagram illustration of a computing device including a memory arrangement, which involves use of NVRAM, in accordance with the principles of the disclosure herein.

FIG. 1 shows an example system or computing device 100 including a memory arrangement 120, which involves use of NVRAM, in accordance with the principles of the disclosure herein. Computing device 100 may, for example, include a processor 110 coupled to memory arrangement 120 via a memory bus 130. Processor 110 may include one or more CPUs 112, which may be arranged on a processor bus (not shown). Processor 110 may also include a memory controller 140 for memory bus 130, and an I/O controller 160 for an I/O bus 150 (e.g., a PCI or PCIe bus). I/O bus 150, which may branch off memory bus 130, may operate on a speed which is lower than memory bus 130 speed. I/O bus 150 may be configured to connect processor 110 and memory arrangement 120 to peripheral components (e.g., printers, network cards, etc.) (not shown) of computing device 100. In accordance with the principles of the present disclosure, an I/O logic circuit or device (e.g., NVRAM write controller 170) may be disposed on I/O bus 150.

I/O logic device/NVRAM write controller 170 may be configured to access memory arrangement 120 over I/O bus 150 independently of CPU 112. NVRAM write controller 170 may, for example, be an application-specific integrated circuit (ASIC) or a field programmable gate array (FPGA) logic chip, which has local buffering and at least one Direct Memory Access (DMA) engine or controller. The DMA engine may be the same or similar to those found, for example, on common computer I/O peripherals (e.g., disk drive controllers, graphics cards, network cards and sound cards). The DMA engine in NVRAM write controller 170 may be configured, for example, to generate addresses and initiate memory write cycles. Further, the DMA engine in NVRAM write controller 170 may contain one or more buffer registers to which data can be written by CPU 112.

In computing device 100/memory arrangement 120, NVRAM may be deployed as individual memory modules (e.g., NVRAM 122) on memory bus 130. Memory bus 130 may be a standard DRAM memory bus, which may also co-host DRAM DIMMs 124. Further, CPUs 112, memory controller 140, I/O controller 160 and I/O bus 150 may have conventional or traditional designs suited for computer architectures that traditionally deploy, for example, only DRAM instead of the NVRAM described herein in primary memory arrangements.

Computing device 100 may be configured so that NVRAM read or load operations (e.g., "load x" 114) by initiated by CPU 112 are performed through normal processor loads (e.g., load/store units) and over memory bus 130 in the same manner or rates as DRAM load operations directly over memory bus 130 via memory controller 140. However, system 100 may be further configured so that the slower NVRAM write or store operations by CPU 112 via memory controller 140 are additionally routed through I/O bus 150/ NVRAM write controller 170. The NVRAM writes/stores may be buffered (e.g., on NVRAM DIMMS) for completion at the slower rates under supervision of NVRAM write controller 170 while CPU 112 is freed to carry out other operations. To avoid overloading or exceeding a capacity of NVRAM write/store buffering mechanisms, CPU 112 may, for example, be restricted to issuing NVRAM write/stores at the rates lower than the rates at which CPU 112 can issue NVRAM read/loads. Further, to avoid write conflicts NVRAM 122 pages involved in a write/store operation may be mapped with only read privileges so that any CPU 112 write instructions to NVRAM 122 via memory controller 140 would return a page exception.

For NVRAM write or store operations (e.g., "write (y)" 116) initiated by CPU 112, system 100 may be configured to use NVRAM write controller 170 to carry out Direct Memory Access (DMA) operations over I/O bus 150. To carry out a write operation (e.g., write (y) 116) CPU 112 may initialize NVRAM write controller 170 via I/O controller 160, for example, with a count of a number of blocks, words or pages to transfer, and the memory address to use. CPU 112 may then send instructions to NVRAM write controller 170 to initiate transfer of data (from NVRAM write controller 170's buffer registers). NVRAM write controller 170 may then provide addresses and write control lines to NVRAM 122. While data transfer from NVRAM write controller 170 to NVRAM 122 is in progress, CPU 112 may be free to conduct other processing operations. NVRAM write controller 170 may be further configured to send an interrupt to CPU 112 when the data transfer to NVRAM 122 is done, or a completion flag is set in the CPU memory space.

The NVRAM write command or instruction (e.g., "write (y)" 116) issued by CPU 112 to NVRAM write controller 170 may, for example, be implemented as an explicit I/O style block write operation, which may, for example, be of a type represented by the following I/O write primitive:

write(void* datablock, int size, long address, bool write_done);
while(!write_done);

According to the first line of the foregoing snippet of code, the I/O style block write operation may write a block of data to an address. According to the second line of the foregoing snippet of code, the I/O style block write operation may wait for a completion flag to indicate that the write is completed. Alternatively, the I/O style block write operation code may involve registering a method or function to be called back upon completion.

In example implementations of computing device 100, NVRAM memory space addresses may be explicitly made known to programmers, and may be updated using I/O write primitives of the kind of described above. A small amount of buffering may be added into I/O space and completion notification logic in NVRAM controller 170. A write operation may be implemented using NVRAM controller 170, for example, with the following (pseudo) code:

write (datablock, size, address, write_done) {
  IO_Set_Completion Flag(&write_done); // tells IO device that this
  variable is to be set when write is done
  IO_Write(datablock, address, NVRAM_buffer_entry); // writes
  datablock and address to a buffer in IO space}

In response, a logic circuit of NVRAM controller 170 may initiate a DMA operation transferring data from a buffered datablock to the associated NVRAM 122, and may then flag completion of the write operation by setting the write_done flag.

Using an I/O logic device (i.e. NVRAM controller 170) connected to I/O bus 150 in the manner described above to accomplish DMA writes to NVRAM 122 may have the benefit of being implementable (e.g., as system 100) without requiring any modification to existing off-the-shelf standard CPUs and memory controllers that are designed for use with DRAM primary memory.

Figure 2:
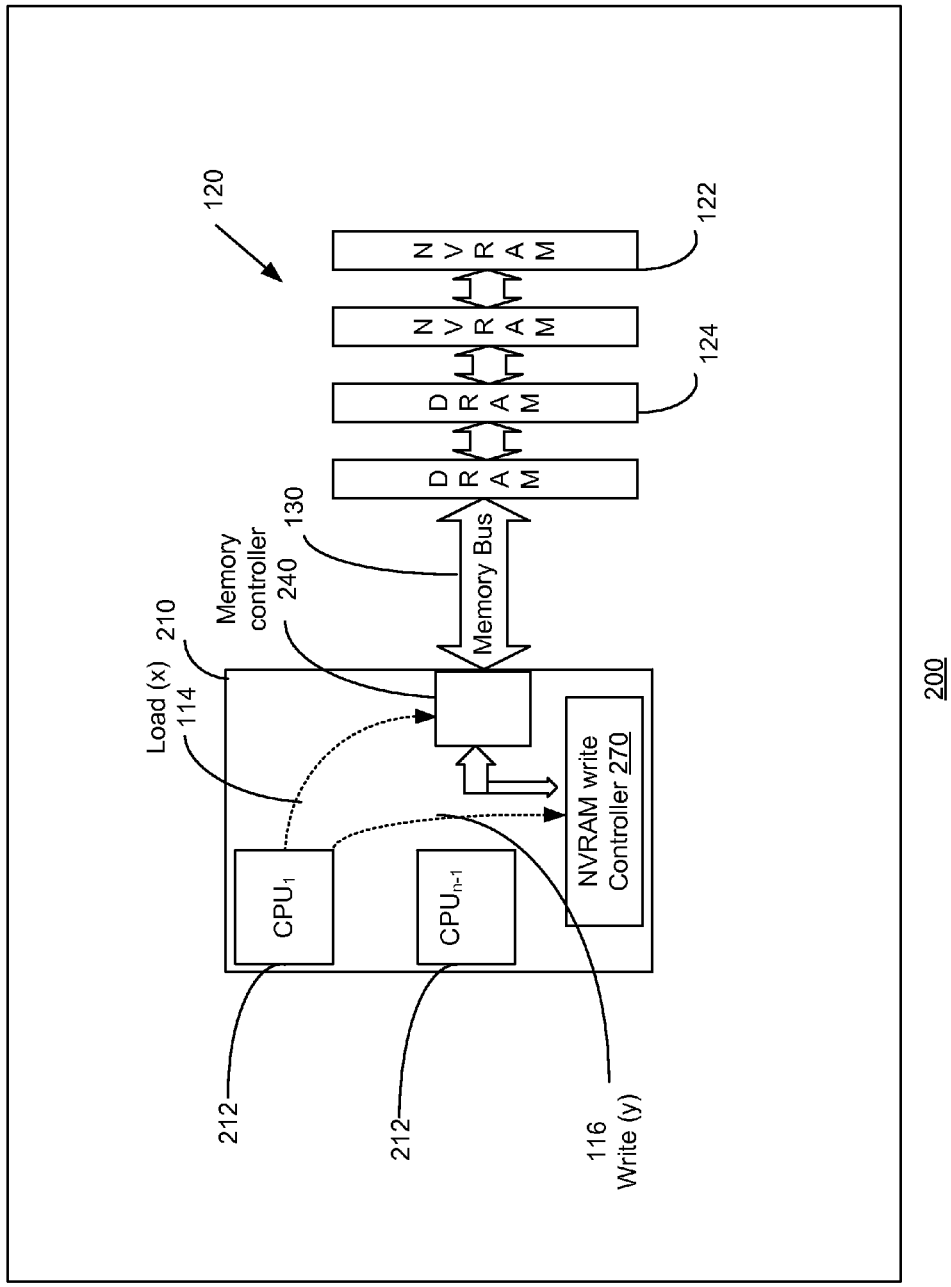
FIG. 2 is a schematic block diagram illustration of a computing device which utilizes a modified processor for managing NVRAM disposed in primary memory of the computing device, in accordance with the principles of the disclosure herein.

However, it may be practical in some computer implementations for managing NVRAM to modify the existing off-the-shelf standard CPUs and memory controllers. An example implementation may modify a design of an existing processor to include a DMA engine (e.g., the DMA engine of NVRAM write controller 170). FIG. 2 shows, for example, a computing device 200, which utilizes such a modified processor 210 for managing NVRAM 122 in primary memory of the computing device, in accordance with the principles of the disclosure herein. Computing device 200 may, for example, include a processor 210 coupled to memory arrangement 120 via memory bus 130. Processor 210, like processor 110, may include one or more CPUs 212, which may be arranged on a processor bus (not shown) and a memory controller 240 for memory bus 130. However, unlike processor 110, processor 220 may include a DMA engine (e.g., NVRAM write controller 270) in the core itself. System 210 may be configured so that CPU 212 may use DMA engine/NVRAM write controller 270 for DMA write operations that move or transfer data to NVRAM 122 in the background even as CPU 212 is carrying out other processing functions. CPU 212 may use DMA engine/NVRAM write controller 270 for DMA write operations to NVRAM 122 in the same or similar manner as CPU 112's use of NVRAM write controller 170 for DMA write operations described above with reference to computing device 100 (FIG. 1). In computing device 200, CPU 212 may use DMA engine/NVRAM write controller 270 for DMA write operations without the overhead that may be associated with I/O bus 150 and I/O controller 160 in computing device 100.

In both computing devices 100 and 200, it may be expected that load or read operations that may be directed or addressed to a portion of NVRAM 122 by respective CPUs 112 and 212 may collide or conflict with concurrent or simultaneous DMA write operations being conducted on the same portion of NVRAM 122 by the respective NVRAM write controllers 170 and 270. To avoid such read-write conflict, both computing devices 100 and 200 may be configured with software to mark as inaccessible designated portions (e.g., words, blocks, lines, pages) of NVRAM 122 that are undergoing DMA write operations and to suspend the CPUs' reading privileges for the designated portions for the duration of the DMA write operations. The designated portions of NVRAM 122 may be re-marked as accessible and reading privileges may be restored for the CPUs only after the respective NVRAM write controllers 170 and 270 set flags or otherwise signal completion of the conflicting DMA write operations.

Alternate or additional schemes to avoid CPU read and NVRAM controller write conflicts in NVRAM memory (e.g., in computing devices 100 and 200) may be hardware based.

Figure 3:
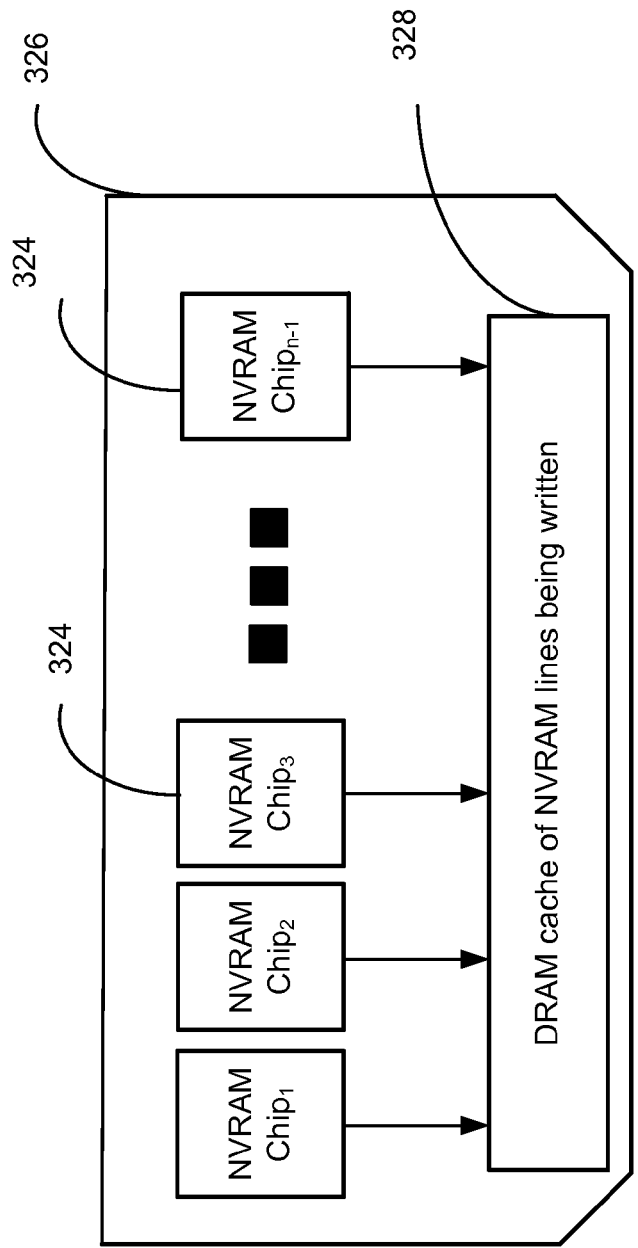
FIG. 3 is a schematic block diagram illustration of an example NVRAM memory module, in accordance with the principles of the disclosure herein.

An example hardware-based scheme to avoid read-write conflicts may include caching a copy of the data stored in a NVRAM memory portion before it is over written by a DMA write operation and making such copy of the data available for reading or loading by the CPUs, in accordance with the principles of the disclosure herein. A "DRAM" cache, which can be written to and read at DRAM speeds, may, for example, be used to hold the copy of the data. FIG. 3 shows an example NVRAM memory module (e.g., NVRAM 322) for implementing the foregoing caching scheme. NVRAM 322 may include a series of NVRAM integrated circuits 324, which may be mounted, for example, on a circuit board 326. NVRAM 322 may further include a DRAM cache 328 mounted on circuit board 326 and coupled to NVRAM integrated circuits 324. NVRAM 322 may be deployed, for example, in primary memory (e.g., memory arrangement 120) of computing devices 100 and 200) shown in FIGS. 1 and 2. The systems may be configured so that before a DMA write operation initiated by NVRAM write controllers 170 or 270 overwrites data in an addressed or target portion (word, line, block, page, etc.) of NVRAM integrated circuits 324, the data in the addressed or target portion is read and copied to DRAM cache 328, for example, by DRAM read and write instructions issued by CPUs 112 or 122. FIG. 3 schematically shows DRAM cache 328 labeled as holding, for example, a copy of NVRAM lines before they are overwritten by a DMA write operation.

Another example hardware-based scheme to avoid read-write conflicts may involve using "RAID-style" data storage schemes similar to those used for hard disk drives configured as redundant arrays of independent disks (RAID). RAID-style data storage schemes may be used for the NVRAM deployed, for example, in memory arrangement 120 of computing devices 100 and 200. The RAID-style data storage schemes may involve configuring computing devices 100 and 200 to encode data in multiple places in the NVRAM for higher reliability either by creating data replicas in the NVRAM or by encoding data in manner (e.g., using error correction codes) that allows reconstruction of data in the portions of the NVRAM that are not accessible during a DMA write operation (or erased, damaged or corrupted) by decoding data in the portions of the NVRAM that are accessible. The replica data or the reconstructed data (which may be referred to herein collectively as "reconstructed data") for the portions of the NVRAM that are not accessible during a DMA write operation may be made available for read or load operations issued by the CPUs in computing devices 100 and 200 concurrently or simultaneously with the DMA write operation.

Figure 4:
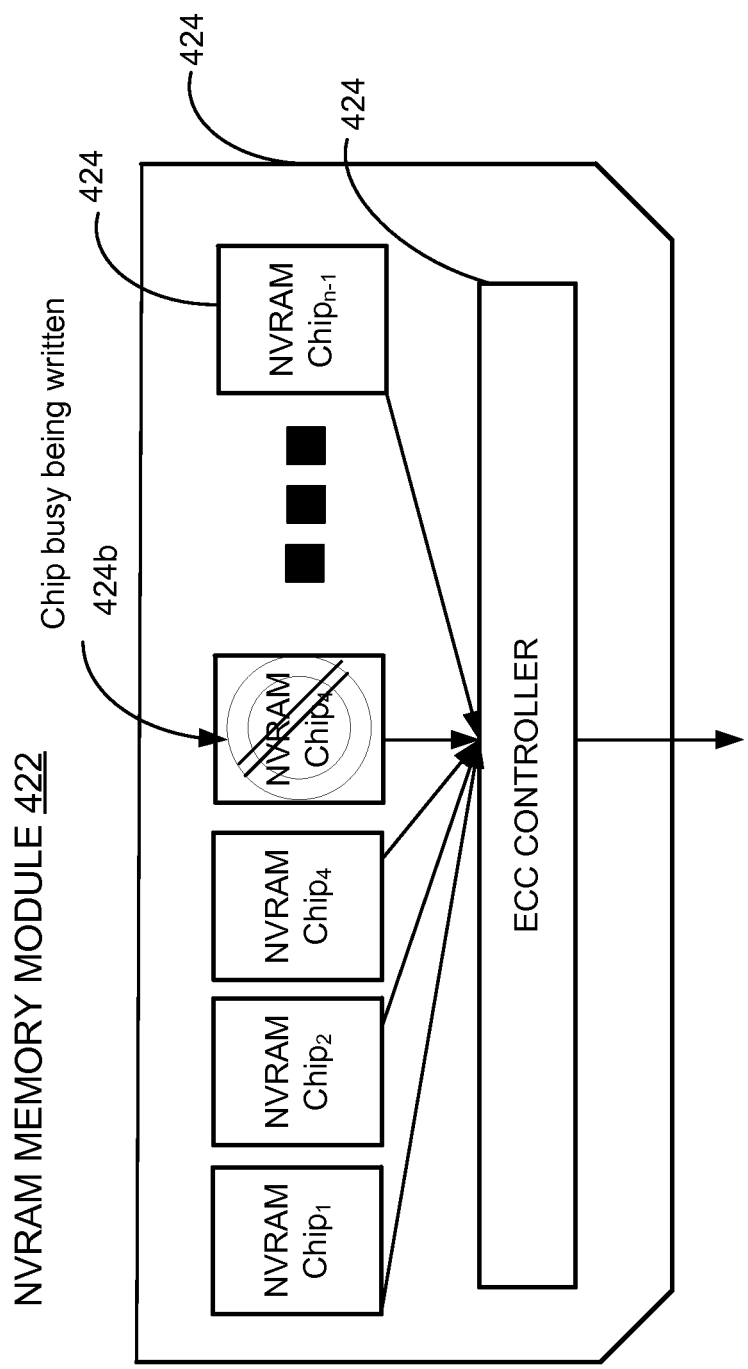
FIG. 4 is a schematic block diagram illustration of another example NVRAM memory module, in accordance with the principles of the disclosure herein.

An example RAID-style data storage scheme may involve using, for example, Reed-Solomon error correction codes. An error correction code (ECC) engine or controller may be used to encode and decode the data. FIG. 4 shows an example NVRAM memory module (e.g., NVRAM 422) configured for implementing the RAID-style data storage scheme that utilizes error correction coding. NVRAM 422 may include a series of NVRAM integrated circuits or chips 424, which may be mounted, for example, on a circuit board 426. NVRAM 422 may further include an error correction code (ECC) controller 428 (e.g., a Reed-Solomon encoder/decoder) mounted on circuit board 426 and coupled to NVRAM integrated circuits or chips 424. NVRAM 422 may be deployed, for example, in primary memory (e.g., memory arrangement 120) of computing devices 100 and 200 shown in FIGS. 1 and 2, respectively. The computing devices may be configured so that when a DMA write operation initiated by NVRAM write controllers 170 or 270 renders an addressed or target portion (word, line, block, page, etc.) of NVRAM integrated circuits or chips 424 inaccessible, the data in the inaccessible portion can be reconstructed by ECC controller 428 using data in portions the NVRAM that are still accessible for "reconstruction" reads. FIG. 4 schematically shows, for example, an inaccessible chip 424' labeled as "chip busy being written to" because of the DMA write operation. In such a case, ECC controller 428 may be configured to read data from the other chips 424 in NVRAM 442 and use the data to compute or reconstruct the contents of busy chip 424b. ECC controller 428 may make the computed or reconstructed contents of busy chip 424b available the CPUs (112 or 212) to complete a read operation issued by the CPUs (112 or 212) concurrently or simultaneously with the DMA write operation.

FIG. 5 shows an example method 500 for deploying and managing NVRAM coupled to a CPU core of a computing device, in accordance with the principles of the disclosure herein. In particular, method 500 may relate to mitigating or managing effects of asymmetrical NVRAM load and store access times (which may be asymmetrical by a factor of 10×) on system performance.

Method 500 may include providing NVRAM as memory modules (e.g., dual-in-line memory modules (DIMMs)) in a memory arrangement coupled to the CPU core of the computing device via a memory bus (510), and configuring the CPU core to conduct NVRAM read operations directly over the memory bus (520). The NVRAM read operations conducted by the CPU core may be similar to DRAM read operations conducted directly over the memory bus.

Method 500 may, further include using an I/O logic device (e.g., a NVRAM write controller) to process NVRAM write instructions initiated by the CPU core as a Direct Memory Access (DMA) write operation on the NVRAM (530). Using an I/O logic device 530 may include using an I/O logic device disposed on an I/O bus of the computing device (532). Alternatively, using an I/O logic device 530 may include using an I/O logic device disposed in the CPU core of the computing device itself (534).

FIG. 6 shows an example method 600 for avoiding NVRAM read-write conflicts in a computing device in which the NVRAM write operations initiated by a CPU core are conducted as Direct Memory Access (DMA) operations at a slower speed than NVRAM read operations initiated by the CPU core, in accordance with the principles of the disclosure herein. The NVRAM write operations initiated by a CPU core may be processed by an I/O logic device, which may be disposed on the a same chip or die as the various CPUs or cores of a processor (e.g., processor 110 or, 210) or disposed in an I/O bus linked to the processor. Method 600 may include making or designating the addresses or portions of the NVRAM to which a NVRAM write operation is directed as being inaccessible to NVRAM read operations initiated by the CPU core for a duration of the NVRAM write operation (610).

Method 600 may further include caching a copy of the data stored at the addresses or portions of the NVRAM before the NVRAM write operation begins (620). Additionally or alternatively, method 600 may involve encoding and decoding data in the NVRAM according to a RAID-style data storage scheme. Method 600 may, for example, involve encoding data in multiple places in the NVRAM to create data replicas in the NVRAM, or encoding data in multiple places in the NVRAM using an error correction code that allows reconstruction of data stored in a portion of the NVRAM that is not read-accessible during a DMA write operation (or erased, damaged or corrupted) by decoding data in a portion or portions of the NVRAM that are read-accessible (630). The reconstruction may involve decoding data in the portions of the NVRAM that remain read-accessible during the DMA write operation. Method 600 may include encoding and decoding data stored in the NVRAM using an Error Correction Code (ECC) controller coupled to the NVRAM (632). The error correction code used to encode/decode the data may, for example, be a Reed-Solomon error correction code.

Method 600 may further involve making a copy (a cached copy, a replica copy or a reconstructed copy) of the data, which was stored at the addresses or portions of the NVRAM before the NVRAM write operation began, available for NVRAM read operations initiated by the CPU core for the duration of the NVRAM write operation (640). It may be necessary to cache a larger portion of the NVRAM than the portion being written in case the architecture of the NVRAM device is such that larger blocks of address space become unavailable for read accesses when issuing stores to subsets of that address space.

A computer system (e.g., computing devices 100 or 200) may be deployed to implement method 500 and/or method 600 in conjunction with a non-transitory computer-readable storage medium having instructions stored thereon. The instructions when executed by one or more microprocessors may cause the computer system to implement method 500 and/or method 600 as described in the foregoing with reference to FIGS. 3 and 4, respectively.

Figure 7:
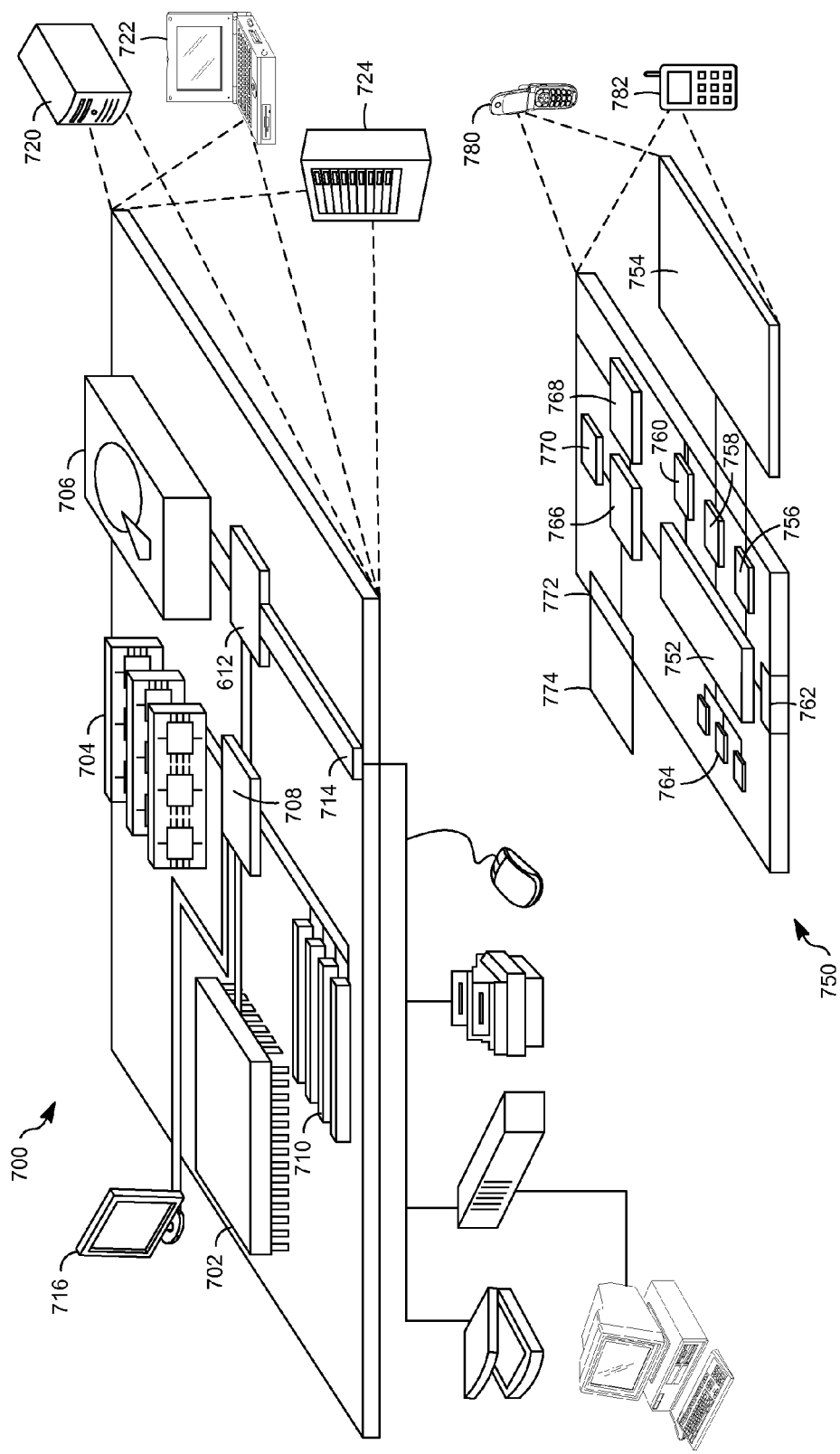
FIG. 7 shows an example of a computer device and a mobile computer device that can be used to implement the techniques described here.

FIG. 7 shows an example of a generic computer device 700 and a generic mobile computer device 750, which may be used with the techniques described here. Computing device 700 is intended to represent various forms of digital computers, such as laptops, desktops, workstations, personal digital assistants, servers, blade servers, mainframes, and other appropriate computers. Computing device 750 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 700 includes a processor 702, a memory 704, a storage device 706, a high-speed interface 708 connecting to memory 704 and high-speed expansion ports 710, and a low speed interface 712 connecting to low speed bus 714 and storage device 706. Each of the components 702, 704, 706, 708, 710, and 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as display 716 coupled to high speed interface 708. In other implementations, multiple processors and/or multiple buses may be used, as appropriate, along with multiple memories and types of memory. Also, multiple computing devices 700 may be connected, with each device providing portions of the necessary operations (e.g., as a server bank, a group of blade servers, or a multi-processor system).

The memory 704 stores information within the computing device 700. In one implementation, the memory 704 is a volatile memory unit or units. In another implementation, the memory 704 is a non-volatile memory unit or units. The memory 704 may also be another form of computer-readable medium, such as a magnetic or optical disk.

The storage device 706 is capable of providing mass storage for the computing device 700. In one implementation, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 704, the storage device 706, or memory on processor 702.

The high speed controller 708 manages bandwidth-intensive operations for the computing device 700, while the low speed controller 712 manages lower bandwidth-intensive operations. Such allocation of functions is exemplary only. In one implementation, the high-speed controller 708 is coupled to memory 704, display 716 (e.g., through a graphics processor or accelerator), and to high-speed expansion ports 710, which may accept various expansion cards (not shown). In the implementation, low-speed controller 712 is coupled to storage device 706 and low-speed expansion port 714. The low-speed expansion port, which may include various communication ports (e.g., USB, BLUETOOTH, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. It may also be implemented as part of a rack server system 724. In addition, it may be implemented in a personal computer such as a laptop computer 722. Alternatively, components from computing device 700 may be combined with other components in a mobile device (not shown), such as device 750. Each of such devices may contain one or more of computing device 700, 750, and an entire system may be made up of multiple computing devices 700, 750 communicating with each other.

Computing device 750 includes a processor 752, memory 764, an input/output device such as a display 754, a communication interface 766, and a transceiver 768, among other components. The device 750 may also be provided with a storage device, such as a microdrive or other device, to provide additional storage. Each of the components 750, 752, 764, 754, 766, and 768, are interconnected using various buses, and several of the components may be mounted on a common motherboard or in other manners as appropriate.

The processor 752 can execute instructions within the computing device 750, including instructions stored in the memory 764. The processor may be implemented as a chipset of chips that include separate and multiple analog and digital processors. The processor may provide, for example, for coordination of the other components of the device 750, such as control of user interfaces, applications run by device 750, and wireless communication by device 750.

Processor 752 may communicate with a user through control interface 758 and display interface 756 coupled to a display 754. The display 754 may be, for example, a TFT LCD (Thin-Film-Transistor Liquid Crystal Display) or an OLED (Organic Light Emitting Diode) display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may be provide in communication with processor 752, so as to enable near area communication of device 750 with other devices. External interface 762 may provide, for example, for wired communication in some implementations, or for wireless communication in other implementations, and multiple interfaces may also be used.

The memory 764 stores information within the computing device 750. The memory 764 can be implemented as one or more of a computer-readable medium or media, a volatile memory unit or units, or a non-volatile memory unit or units. Expansion memory 774 may also be provided and connected to device 750 through expansion interface 772, which may include, for example, a SIMM (Single In Line Memory Module) card interface. Such expansion memory 774 may provide extra storage space for device 750, or may also store applications or other information for device 750. Specifically, expansion memory 774 may include instructions to carry out or supplement the processes described above, and may include secure information also. Thus, for example, expansion memory 774 may be provide as a security module for device 750, and may be programmed with instructions that permit secure use of device 750. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 764, expansion memory 774, or memory on processor 752 that may be received, for example, over transceiver 768 or external interface 762.

Device 750 may communicate wirelessly through communication interface 766, which may include digital signal processing circuitry where necessary. Communication interface 766 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 768. In addition, short-range communication may occur, such as using a Bluetooth, WiFi, or other such transceiver (not shown). In addition, GPS (Global Positioning System) receiver module 770 may provide additional navigation- and location-related wireless data to device 750, which may be used as appropriate by applications running on device 750.

Device 750 may also communicate audibly using audio codec 760, which may receive spoken information from a user and convert it to usable digital information. Audio codec 760 may likewise generate audible sound for a user, such as through a speaker, e.g., in a handset of device 750. Such sound may include sound from voice telephone calls, may include recorded sound (e.g., voice messages, music files, etc.) and may also include sound generated by applications operating on device 750.

The computing device 750 may be implemented in a number of different forms, as shown in the figure. For example, it may be implemented as a cellular telephone 750. It may also be implemented as part of a smart phone 752, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" or "computer-readable medium" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of implementations have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method comprising:
providing non-volatile random access memory (NVRAM) in a primary memory of a computing device, the primary memory including dynamic random access memory (DRAM), the primary memory coupled to a central processing unit (CPU) core of a computing device via a memory bus, the CPU core configured to conduct NVRAM read operations directly over the memory bus; and
using an input/output (I/O) logic device coupled to the CPU core to process a write instruction initiated by the CPU core as a Direct Memory Access (DMA) write operation on the NVRAM, the I/O logic device coupled to the CPU core as a peripheral device to the computing device via an I/O bus.

2. The method of claim 1, wherein the I/O logic device is disposed on an I/O bus of the computing device.

3. The method of claim 1, wherein the I/O logic device is disposed in a same die as the CPU core of the computing device.

4. The method of claim 1, wherein providing NVRAM in a primary memory of the computing device includes:

providing the NVRAM as a memory module in the primary memory.

5. The method of claim 4, wherein providing the NVRAM as a memory module in the primary memory includes:
providing the NVRAM as a dual in-line memory module (DIMM) in the primary memory.

6. The method of claim 1 further comprising designating a portion of the NVRAM to which a NVRAM write operation is directed as being inaccessible to a NVRAM read operation initiated by the CPU core for a duration of the NVRAM write operation.

7. The method of claim 6 further comprising caching a copy of data stored at the portion of the NVRAM before the NVRAM write operation begins.

8. The method of claim 7 further comprising making the cached copy of the data available for the NVRAM read operation initiated by the CPU core for at least the duration of the NVRAM write operation.

9. The method of claim 1 further comprising encoding data in multiple places in the NVRAM to create data replicas in the NVRAM.

10. The method of claim 1 further comprising encoding data in multiple places in the NVRAM using an error correction code that allows reconstruction of data stored in a portion of the NVRAM that is not read-accessible during a DMA write operation by decoding data in a portion or portions of the NVRAM that are read-accessible.

11. The method of claim 10 wherein the error correction code is a Reed-Solomon error correction code.

12. The method of claim 10 further comprising encoding and decoding data stored in the NVRAM using an Error Correction Code (ECC) controller coupled to the NVRAM.

13. The method of claim 10 further comprising making a reconstructed copy of the data stored at the portion of the NVRAM before the NVRAM write operation began available to the NVRAM read operation initiated by the CPU core for a duration of the NVRAM write operation.

14. A computing device comprising:
a processor including one or more central processing units (CPUs), the CPUs coupled to a primary memory of the computing device disposed on a memory bus, the primary memory including dynamic random-access memory (DRAM), the CPUs coupled to the primary memory via the memory bus and a memory controller;
a non-volatile random access memory (NVRAM) disposed in the primary memory; and
a NVRAM write controller connected to the CPUs and the primary memory, the NVRAM write controller configured to access the primary memory independently of the one or more CPUs,
wherein the processor is configured to conduct NVRAM read operations initiated by the one or more CPUs through the memory controller and to conduct NVRAM write operations initiated by the one or more CPUs through the NVRAM write controller configured to access the primary memory independently of the one or more CPUs.

15. The computing device of claim 14, wherein the NVRAM write controller is disposed on I/O bus connected to the one or more CPUs and the primary memory of the computing device.

16. The computing device of claim 14, wherein the NVRAM write controller is disposed on a same die as a CPU.

17. The computing device of claim 14, wherein the NVRAM write controller includes one or more buffer registers and a Direct Memory Access (DMA) engine configured to generate addresses and initiate memory write cycles.

18. The computing device of claim 17, wherein a CPU is configured to carry out a NVRAM write operation by:
initializing the NVRAM write controller with a count of a number of blocks of data to transfer from the one or more buffer registers, and the memory addresses to use for the NVRAM write operation, and
initiating transfer of data from the NVRAM write controller to the NVRAM; and
wherein the NVRAM write controller is configured to provide the memory addresses and write control lines to the NVRAM.

19. The computing device of claim 18, wherein the CPU is free to conduct other processing operations while data transfer from NVRAM write controller to the NVRAM is in progress.

20. The computing device of claim 19, wherein NVRAM write controller is configured to send an interrupt to the CPU when the data transfer to NVRAM is done.

21. The computing device of claim 18, wherein a CPU is configured to carry out a NVRAM write operation as an explicit I/O style block write operation of a type represented by the following I/O write primitive:
write(void* datablock, int size, long address, bool write_done); while(!write_done).

22. The computing device of claim 21, wherein the I/O style block write operation involves setting a flag upon completion or registering a function to be called back upon completion.

23. The computing device of claim 18 further configured to designate a portion of the NVRAM undergoing a NVRAM write operation as being inaccessible to the one or more CPUs for a duration of the NVRAM write operation.

24. The computing device of claim 23 further configured to make a copy of data stored in the portion of the NVRAM before the NVRAM write operation begins and to make the copy available for NVRAM read operations initiated by the one or more CPUs for at least the duration of the NVRAM write operation.

25. The computing device of claim 24, wherein the copy of data stored in the portion of the NVRAM before the NVRAM write operation begins is a cached data copy, a replica data copy or a reconstructed data copy.

* * * * *